United States Patent
Kim

(10) Patent No.: US 6,762,463 B2
(45) Date of Patent: Jul. 13, 2004

(54) MOSFET WITH SIGE SOURCE/DRAIN REGIONS AND EPITAXIAL GATE DIELECTRIC

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/877,906

(22) Filed: Jun. 9, 2001

(65) Prior Publication Data

US 2002/0185697 A1 Dec. 12, 2002

(51) Int. Cl.$^7$ .................. H01L 29/94; H01L 31/119
(52) U.S. Cl. .................. 257/368; 257/310
(58) Field of Search .................. 257/368, 369, 257/296, 314, 315, 310; 438/199, 238, 239, 386, 399, 201, 211, 257

(56) References Cited

U.S. PATENT DOCUMENTS

| | | | | |
|---|---|---|---|---|
| 4,466,172 A | * | 8/1984 | Batra | 438/287 |
| 5,880,508 A | * | 3/1999 | Wu | 257/411 |
| 6,198,138 B1 | * | 3/2001 | Hirota | 257/368 |
| 6,255,698 B1 | * | 7/2001 | Gardner et al. | 257/369 |
| 6,353,249 B1 | * | 3/2002 | Boyd et al. | 257/369 |
| 6,353,259 B1 | * | 3/2002 | Sato et al. | 257/369 |
| 6,362,065 B1 | * | 3/2002 | Swanson et al. | 438/344 |
| 6,368,907 B1 | * | 4/2002 | Doi et al. | 438/217 |
| 6,373,114 B1 | * | 4/2002 | Jeng et al. | 257/413 |
| 6,406,945 B1 | * | 6/2002 | Lee et al. | 438/142 |
| 6,406,973 B1 | * | 6/2002 | Lee | 438/416 |
| 6,483,151 B2 | * | 11/2002 | Wakabayashi et al. | 257/369 |
| 2001/0020723 A1 | * | 9/2001 | Gardner et al. | 257/368 |
| 2002/0000607 A1 | * | 1/2002 | Pfirsch | 257/328 |
| 2002/0014662 A1 | * | 2/2002 | Yamazaki et al. | 257/347 |

* cited by examiner

Primary Examiner—Steven Loke
Assistant Examiner—Douglas W. Owens
(74) Attorney, Agent, or Firm—Farjami & Farjami LLP

(57) ABSTRACT

In accordance with the invention, a MOSFET includes a well, a channel formed in the well, a high K layer overlying the channel, a buffer layer overlying the high k layer, a gate overlaying the buffer layer, a blocking layer overlying the gate and two source/drain regions. In some embodiments the gate and the source/drain regions are silicon germanium.

15 Claims, 4 Drawing Sheets

MOSFET WITH SIGE SOURCE/DRAIN REGIONS AND EPITAXIAL GATE DIELECTRIC

BACKGROUND

FIG. 1 illustrates a conventional MOSFET 10. The device is formed in a p-well or an n-well 11 formed in a silicon substrate (not shown). A channel 12 is then doped by, for example, ion implantation. A high dielectric constant (k) film 15 is then formed over the device by chemical vapor deposition (CVD) or sputtering. The gate, typically poly silicon or metal, is then formed over the high k film. Portions of the gate and the high k film are then etched away to expose source/drain regions 13, which are then doped.

The device is annealed, typically at about 1100° C., to activate the p- and n-type dopants. During the high temperature anneal, the channel region 12 and the high k layer 15 react to form an interfacial layer 14. The interfacial layer and the high k film together have a lower capacitance than the high k film alone. The reduced capacitance caused by interfacial layer 14 reduces the driving current of the device and thereby reduces the operating speed of the device.

SUMMARY

In accordance with a first embodiment of the invention, a MOSFET includes a well, a channel formed in the well, a high K layer overlying the channel, a buffer layer overlying the high k layer, a gate overlying the buffer layer, a blocking layer overlying the gate and two source/drain regions. In some embodiments the high k layer is an epitaxial metal oxide. In embodiments the buffer and blocking layers are epitaxial silicon. In some embodiments the gate and the source/drain regions are amorphous silicon germanium. In accordance with another embodiment of the invention, a MOSFET includes a well, a channel formed in the well, a high K layer overlying the channel, a metal gate overlying the high k layer, and two silicon germanium source/drain regions.

DETAILED DESCRIPTION

In accordance with embodiments of the invention, the source/drain regions and/or the gate of a MOSFET are silicon/germanium.

Figure 2:
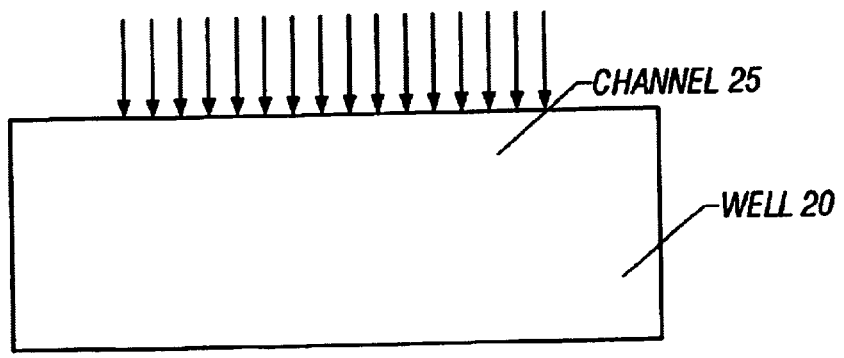
FIGS. 2–8 illustrate an embodiment of the present invention at various stages in fabrication.

FIGS. 2–8 illustrate the fabrication of one embodiment of the present invention. Referring now to FIG. 2, first an n-well or a p-well 20 is formed on a substrate (not shown). The channel 25 of the device is implanted with a p- or n-type dopant, depending if the device is a p-channel device or an n-channel device. A common p-type dopant is boron, and common n-type dopants are phosphorus or arsenic.

Figure 3:
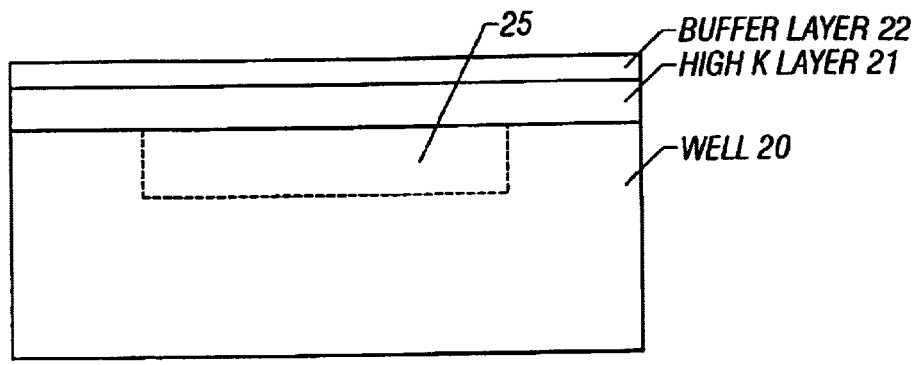
Figure 9:
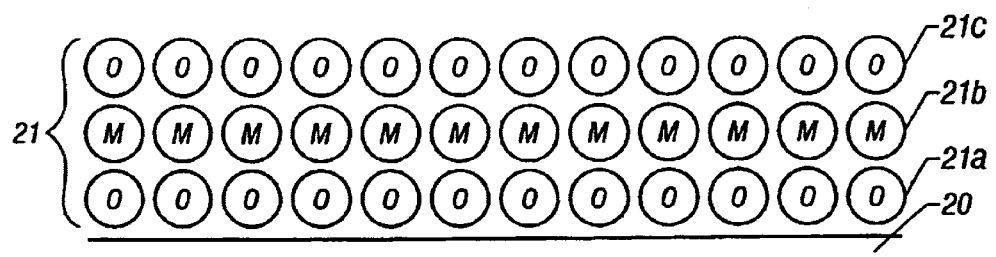
FIG. 9 illustrates an epitaxial high k layer.

In FIG. 3, a high k dielectric layer 21 is grown over the substrate including the implanted channel. High k dielectric layer may be, for example, a metal oxide, such as, for example, zircon oxide, titanium oxide, tantalum oxide, or haihium oxide. The high k dielectric layer is grown epitaxially as illustrated in FIG. 9. The high k dielectric layer includes alternating monolayers of oxygen 21a and metal 21b. Epitaxial high k dielectric layer 21, and other epitaxial layers described below, may be grown, for example, by molecular beam epitaxy (MBE), chemical vapor deposition (CVD) or other epitaxial techniques. The high k dielectric layer is thick enough to have a leakage current blocking capability equivalent to a ten angstrom thick layer of $SiO_2$. The appropriate thickness of the high k dielectric layer can be determined as follows. The thickness of the high k dielectric layer is defined by the boundary equation $e_1 E_1 = e_2 E_2$, where e is a dielectric constant and E is the electric field, given by the applied bias in volts divided by the material thickness. The boundary equation therefore simplifies to $e_1/t_1 = e_2/t_2$, where t is the material thickness. For a given high k material, the required thickness can be determined by plugging in the dielectric constant of $SiO_2$ and a ten angstrom thickness of $SiO_2$ on the left hand side of the equation, plugging in the dielectric constant of the selected high k material, then solving for $t_2$.

After the epitaxial high k layer is grown, an epitaxial silicon buffer layer 22 is grown over the high k layer. Usually, the buffer layer is less than ten layers of atomic undoped silicon, preferably 2 to 3 layers.

Figure 4:
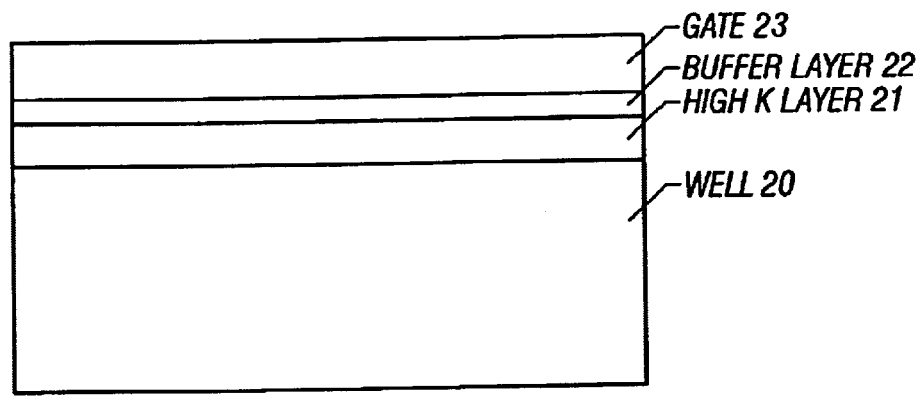
Figure 5:
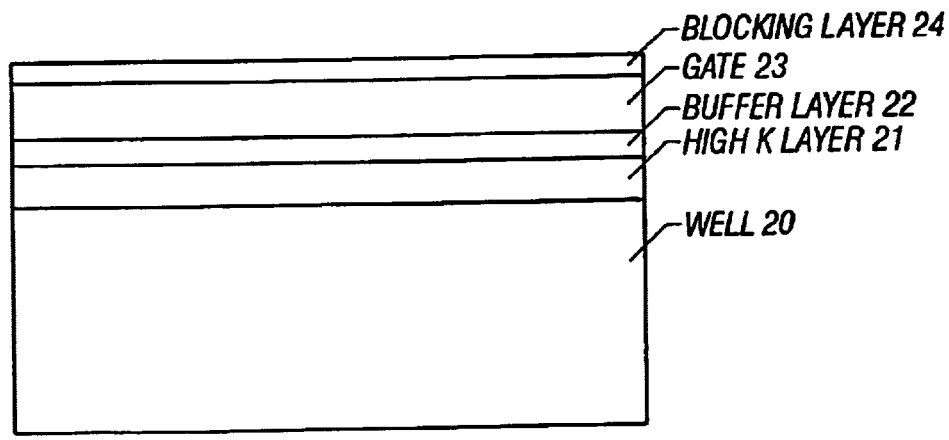

Gate 23 is then deposited over buffer layer 22, as illustrated in FIG. 4. Gate 23 may be, for example, an epitaxial layer containing silicon and germanium. A blocking layer 24, similar to buffer layer 22, is deposited over gate 23. Blocking layer 24 may be, for example, an epitaxial silicon layer. Usually, the blocking layer is less than ten layers of atomic undoped silicon, preferably 2 to 3 layers. The presence of buffer layer 22 prevents germanium from gate 23 from contaminating high k layer 21 during thermal cycling. Similarly, the presence of blocking layer 24 prevents germanium from gate 23 from vaporizing during thermal cycling. In some embodiments, buffer layer 22 and blocking layer 24 are thin layers, on the order of only a few layers of silicon atoms thick.

Figure 6:
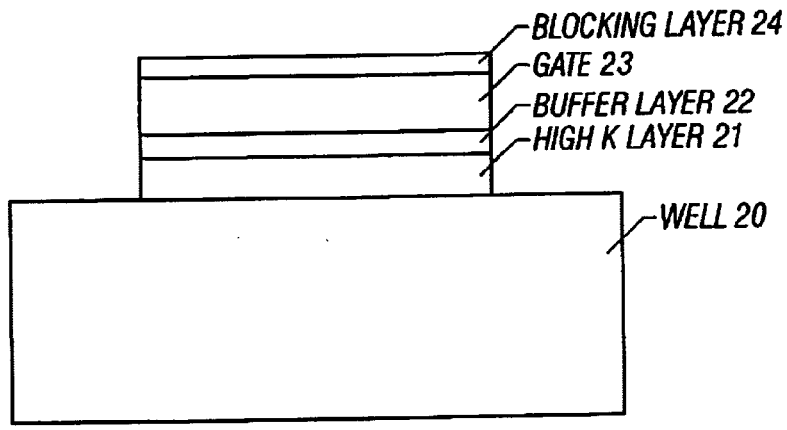
Figure 7:
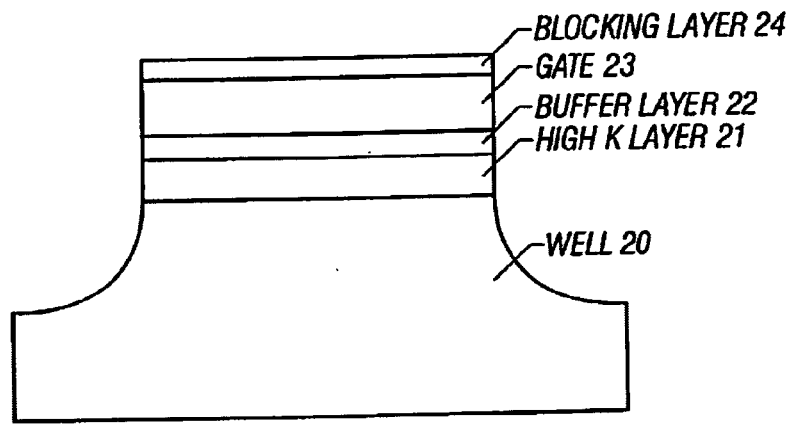

Turning now to FIG. 6, portions of high k layer 21, buffer layer 22, gate 23, and blocking layer 24 are etched away, for example in an anisotropic etch, to expose the areas of well 20 where the source/drain regions will be formed. In a second etch, for example, an isotropic etch, illustrated in FIG. 7, portions of well 20 are removed. In one embodiment, a single etch removes portions of high k layer 21, buffer layer 22, gate 23, blocking layer 24, and well 20. Depending on the size of the device, the source/drain regions may be about 100 to 1000 angstroms deep.

Figure 8:
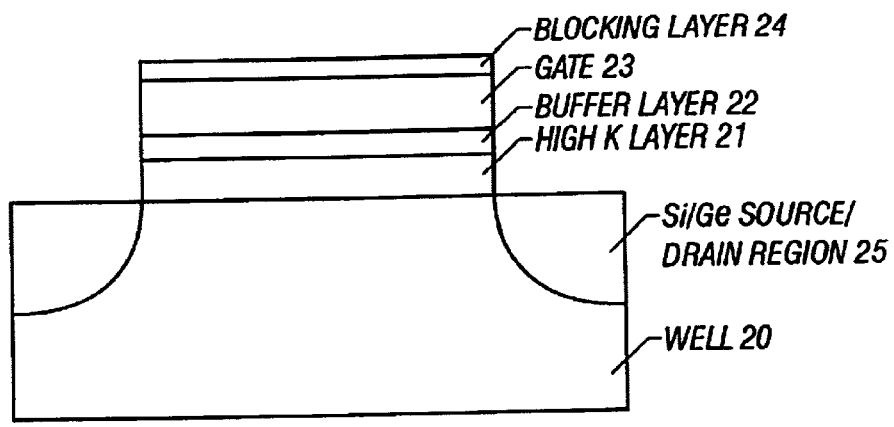

In FIG. 8, the source/drain regions 25 of the device are formed in the spaces left by the removal of portions of well 20. Source/drain regions 25 may be, for example, amorphous or epitaxial silicon and germanium. New material is grown in the spaces in well 20 to form source/drain regions 25. Source/drain regions 25 are then doped. A contact, for example titanium nitride or nickel nitride (not shown) is then deposited over blocking layer 24.

Figure 10:
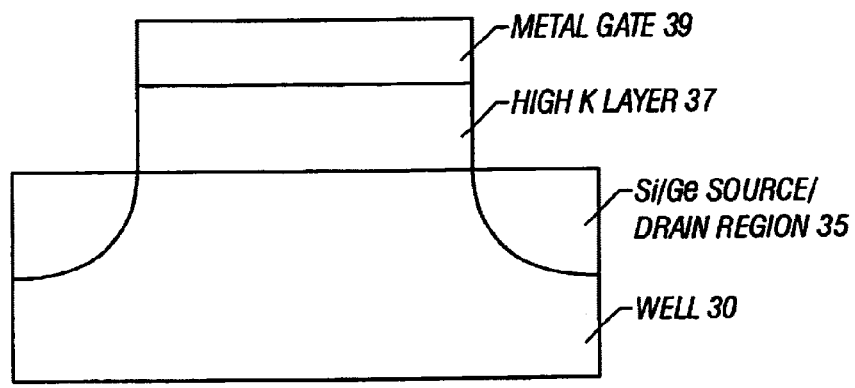
FIG. 10 illustrates another embodiment of the present invention.

FIG. 10 illustrates a second embodiment of the invention. A metal gate 39 is used instead of a silicon germanium gate. Thus, the buffer layer and blocking layer described above are not necessary to prevent migration of germanium.

In accordance with embodiments of the invention, a device with a silicon/germanium source/drain region and/or a silicon/germanium gate may offer advantages.

First, the presence of germanium in the gate and/or the source/drain regions of the device may lower the temperature at which the device is annealed to activate dopants in the channel region. Typically, as described above, devices such as that illustrated in FIG. 1 are annealed at temperatures of about 1050° C. to 1100° C. to activate dopants in the channel. Annealing at temperatures of 1050° C. or 1100° C. can destroy the channel by diffusion between the source/drain regions. In devices such as that illustrated in FIG. 8, annealing temperatures as low as 750° C., usually 850° C. to 900° C., have been observed to be effective at activating the dopants. Lower processing temperature reduces or eliminates the interfacial layer shown in the device illustrated in FIG. 1 and reduces the amount of diffusion between the source/drain regions. Elimination of the interfacial layer may increase the capacitance of the device, which increases the speed of the device.

Figure 1:
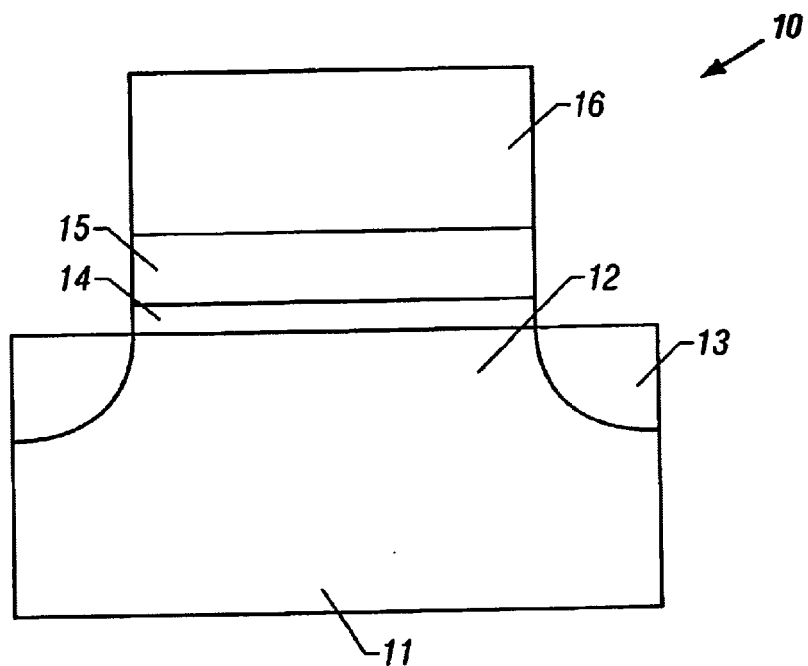
FIG. 1 illustrates a prior art MOSFET.

Second, elimination of interfacial layer 14 of FIG. 1 increases the operating speed of the device by increasing the capacitance. In addition, elimination of the interfacial layer reduces the problem of leakage current in the channel. High k layer 21 is a more effective leakage current blocker than interfacial layer 14 of FIG. 1. As a result, for the same leakage current blocking effectiveness, a high k layer 21 can be thinner than the high k layer/interfacial layer combination of FIG. 1. A thinner layer has higher capacitance and therefore faster operating speed than a thicker layer. Accordingly, for the same operating speed, a device without interfacial layer 14 may block more leakage current than a device with interfacial layer 14.

Third, the presence of germanium in gate 23 may make the gate more conductive.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention.

What is being claimed is:

1. A semiconductor device formed on a substrate and comprising:
   a well, said well comprising two silicon germanium filled spaces and a remaining portion, said remaining portion of said well not comprising silicon germanium;
   a channel region of first conductivity type and being in the well;
   a dielectric layer overlying the channel region; and
   a gate electrode overlying the dielectric layer;
   wherein said two silicon germanium filled spaces comprise respective source/drain regions of second conductivity type, said respective source/drain regions being situated on opposite sides of the channel region.

2. The device of claim 1 wherein the gate electrode comprises a metal.

3. The device of claim 1 wherein each of the source/drain regions has a depth of about 100 to about 1000 Angstroms.

4. The device of claim 1 wherein the source/drain regions comprise amorphous material.

5. A semiconductor device formed on a substrate and comprising:
   a well;
   a channel region of first conductivity type and being in said well;
   a dielectric layer overlying said channel region;
   a diffusion barrier layer overlying said dielectric layer;
   a gate electrode overlying said diffusion barrier layer;
   a blocking layer overlying said gate electrode; and
   two source/drain regions of second conductivity type formed on opposite sides of said channel region;
   wherein each of said dielectric layer, said diffusion barrier layer, and said blocking layer comprise epitaxial layers.

6. The device of claim 5 wherein said gate electrode comprises silicon germanium.

7. The device of claim 5 wherein each of said source/drain regions comprises silicon germanium.

8. The device of claim 5 wherein each of said source/drain regions comprises amorphous silicon germanium.

9. The device of claim 5 wherein said dielectric layer is selected from the group consisting of oxides of zircon, oxides of titanium, oxides of tantalum, and oxides of hafnium.

10. The device of claim 5 wherein said blocking layer comprises less than or equal to ten atomic monolayers.

11. The device of claim 5 wherein said diffusion barrier layer comprises less than or equal to ten atomic monolayers.

12. A semiconductor device formed on a substrate and comprising:
    a well;
    a channel region of first conductivity type and being in the well;
    a dielectric layer overlying the channel region;
    a diffusion barrier layer directly overlying and in contact with the dielectric layer, said diffusion barrier layer being a single layer;
    a gate electrode directly overlying and in contact with the diffusion barrier layer, said gate electrode layer comprising a semiconductor material;
    a blocking layer overlying the gate electrode;
    two source/drain regions of second conductivity type formed on opposite sides of the channel region;
    wherein each of the dielectric layer, the diffusion barrier layer, and the blocking layer comprise epitaxial layers.

13. A semiconductor device formed on a substrate and comprising:
    a well;
    a channel region of first conductivity type and being in the well;
    a dielectric layer overlying the channel region;
    a diffusion barrier layer directly overlying and in contact with the dielectric layer, said diffusion barrier layer being a single layer;
    a gate electrode directly overlying and in contact with the diffusion barrier layer, said gate electrode layer comprising a semiconductor material;
    a blocking layer overlying the gate electrode;
    two source/drain regions of second conductivity type formed on opposite sides of the channel region;
    wherein the gate electrode comprises silicon germanium.

14. A semiconductor device formed on a substrate and comprising:
    a well;
    a channel region of first conductivity type and being in the well;
    a dielectric layer overlying the channel region;
    a diffusion barrier layer directly overlying and in contact with the dielectric layer, said diffusion barrier layer being a single layer;

a gate electrode directly overlying and in contact with the diffusion barrier layer, said gate electrode layer comprising a semiconductor material;

a blocking layer overlying the gate electrode;

two source/drain regions of second conductivity type formed on opposite sides of the channel region;

wherein each of the source/drain regions comprises silicon germanium.

15. The device of claim 14 wherein each of the source/drain regions comprises amorphous silicon germanium.

* * * * *